US011517922B2

(12) United States Patent
    Arai (10) Patent No.: US 11,517,922 B2
(45) Date of Patent: Dec. 6, 2022

(54) LIQUID DISCHARGE APPARATUS, IMPRINT APPARATUS, AND METHOD

(71) Applicant: CANON KABUSHIKI KAISHA, Tokyo (JP)

(72) Inventor: Tsuyoshi Arai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/203,941

(22) Filed: Nov. 29, 2018

(65) Prior Publication Data

US 2019/0168241 A1    Jun. 6, 2019

(30) Foreign Application Priority Data

Dec. 4, 2017 (JP) .............................. JP2017-232740

(51) Int. Cl.
    B05B 1/28       (2006.01)
    B05B 1/32       (2006.01)
    (Continued)

(52) U.S. Cl.
    CPC ................ B05B 1/28 (2013.01); B05B 1/323 (2013.01); B05B 15/40 (2018.02); B05B 15/50 (2018.02);
    (Continued)

(58) Field of Classification Search
    CPC ........... B05B 1/28; B05B 15/40; B05B 15/50; B05B 1/323; G03F 7/0002; G03F 7/2002;
    (Continued)

(56) References Cited

U.S. PATENT DOCUMENTS 5,670,997 A * 9/1997 Sugimoto ............ B41J 2/16508
                                                        347/30
5,784,081 A * 7/1998 Ozaki .................. B41J 2/16523
                                                        347/30
(Continued)

FOREIGN PATENT DOCUMENTS

JP        2004-291242      10/2004
JP        2006-095766       4/2006
(Continued)

OTHER PUBLICATIONS

Office Action dated May 21, 2021 in counterpart Korean Application No. 10-2018-0153445, together with English translation thereof.
(Continued)

*Primary Examiner* — Tuongminh N Pham
(74) *Attorney, Agent, or Firm* — Venable LLP (57) ABSTRACT

A liquid discharge apparatus includes: a discharge head including a discharge portion configured to discharge a liquid; a cap configured to cap the discharge portion; a suction unit configured to suck an interior of the cap through a first fluid passage communicating with the interior of the cap in a state in which the cap caps the discharge portion; an open/close unit configured to open/close a second fluid passage communicating with the interior of the cap, the open/close unit being set in an open state when a negative pressure state of the interior of the cap, which is generated by suction by the suction unit, is canceled; and a filter arranged in the second fluid passage.

16 Claims, 7 Drawing Sheets

(51) Int. Cl.
  *B05B 15/40* (2018.01)
  *B05B 15/50* (2018.01)
  *G03F 7/20* (2006.01)
  *G03F 7/00* (2006.01)
  *G03F 7/16* (2006.01)

(52) U.S. Cl.
  CPC .......... *G03F 7/0002* (2013.01); *G03F 7/2002* (2013.01); *G03F 7/16* (2013.01)

(58) Field of Classification Search
  CPC ......... G03F 7/16; B41J 2/165; B41J 2/16505; B41J 2/16508
  USPC ..... 239/106, 124, 126, 590.3, 569; 222/152, 222/189.06
  See application file for complete search history.

(56) References Cited

U.S. PATENT DOCUMENTS

| | | | | |
|---|---|---|---|---|
| 6,481,826 B1* | 11/2002 | Hara | ................... | B41J 2/16508 347/29 |
| 6,540,322 B2* | 4/2003 | Usui | ................... | B41J 2/16508 347/29 |
| 7,104,628 B2* | 9/2006 | Yamazaki | ............ | B41J 2/16508 347/29 |
| 7,410,249 B2* | 8/2008 | Inoue | ........................ | B41J 2/18 347/30 |
| 7,494,205 B2* | 2/2009 | Kusunoki | ............ | B41J 2/16511 347/29 |
| 7,806,504 B2* | 10/2010 | Taira | ................... | B41J 2/16508 347/29 |
| 7,931,525 B2* | 4/2011 | Lehnert | ............... | F24F 13/1486 454/290 |
| 9,387,677 B2 | 7/2016 | Kanome et al. | | |
| 2004/0085389 A1* | 5/2004 | Smith | ................... | B41J 2/16508 347/34 |
| 2005/0024422 A1* | 2/2005 | Danzuka | ............... | B41J 2/16538 347/29 |
| 2006/0066697 A1 | 3/2006 | Inoue | .............................. | 347/89 |
| 2010/0193055 A1* | 8/2010 | Ishii | .................... | B41J 2/16523 137/582 |
| 2016/0052274 A1 | 2/2016 | Kanome et al. | | |
| 2017/0259574 A1* | 9/2017 | Fujioka | ................ | B41J 2/16526 |
| 2017/0354986 A1* | 12/2017 | Casas Cazalla | ........ | B05B 15/40 |
| 2019/0168241 A1* | 6/2019 | Arai | ........................ | B05B 1/323 |

FOREIGN PATENT DOCUMENTS

| | | |
|---|---|---|
| JP | 2010-120294 | 6/2010 |
| JP | 2011-143543 | 7/2011 |
| JP | 2016-43540 A | 4/2016 |
| JP | 2016-141032 | 8/2016 |
| JP | 2017-120928 | 7/2017 |

OTHER PUBLICATIONS

Office Action dated Jul. 5, 2021 in counterpart Japanese Application No. 2017-232740, together with English translation thereof.

* cited by examiner

LIQUID DISCHARGE APPARATUS, IMPRINT APPARATUS, AND METHOD

BACKGROUND OF THE INVENTION

Field of the Invention

The present invention relates to a liquid discharge apparatus.

Description of the Related Art

In a liquid discharge apparatus for discharging a liquid, there is known a mechanism for sucking a discharge portion as the maintenance and recovery process of discharge performance. In this mechanism, the interior of a cap is sucked by a pump in a state in which the discharge portion is capped by the cap (for example, Japanese Patent Laid-Open No. 2016-43540). The interior of the cap is set in a negative pressure state, and a liquid, bubble, dust, and the like attached to the nozzle of the discharge portion and its peripheral portion can forcibly be removed.

After the suction, the negative pressure state must be canceled in the interior of the cap to separate the cap from the discharge portion. As a technique for this, a passage communicating with the interior of the cap must be opened to open the interior to outer air. Accordingly, the negative pressure state of the interior of the cap is canceled to allow separation of the cap from the discharge portion. When the passage is opened to the outer air, particles present in the outer atmosphere may be sucked inside the cap. If the sucked particles are attached to the discharge portion, the particles may be mixed in the liquid when discharging the liquid. This may cause degradation of the quality of a discharge target object.

SUMMARY OF THE INVENTION

The present invention provides a technique for preventing particles from attached to a discharge portion when a negative pressure state is canceled.

According to an aspect of the present invention, there is provided a liquid discharge apparatus comprising: a discharge head including a discharge portion configured to discharge a liquid; a cap configured to cap the discharge portion; a suction unit configured to suck an interior of the cap through a first fluid passage communicating with the interior of the cap in a state in which the cap caps the discharge portion; an open/close unit configured to open/close a second fluid passage communicating with the interior of the cap, the open/close unit being set in an open state when a negative pressure state of the interior of the cap, which is generated by suction by the suction unit, is canceled; and a filter arranged in the second fluid passage.

Further features of the present invention will become apparent from the following description of exemplary embodiments (with reference to the attached drawings).

DESCRIPTION OF THE EMBODIMENTS

First Embodiment

Figure 1:
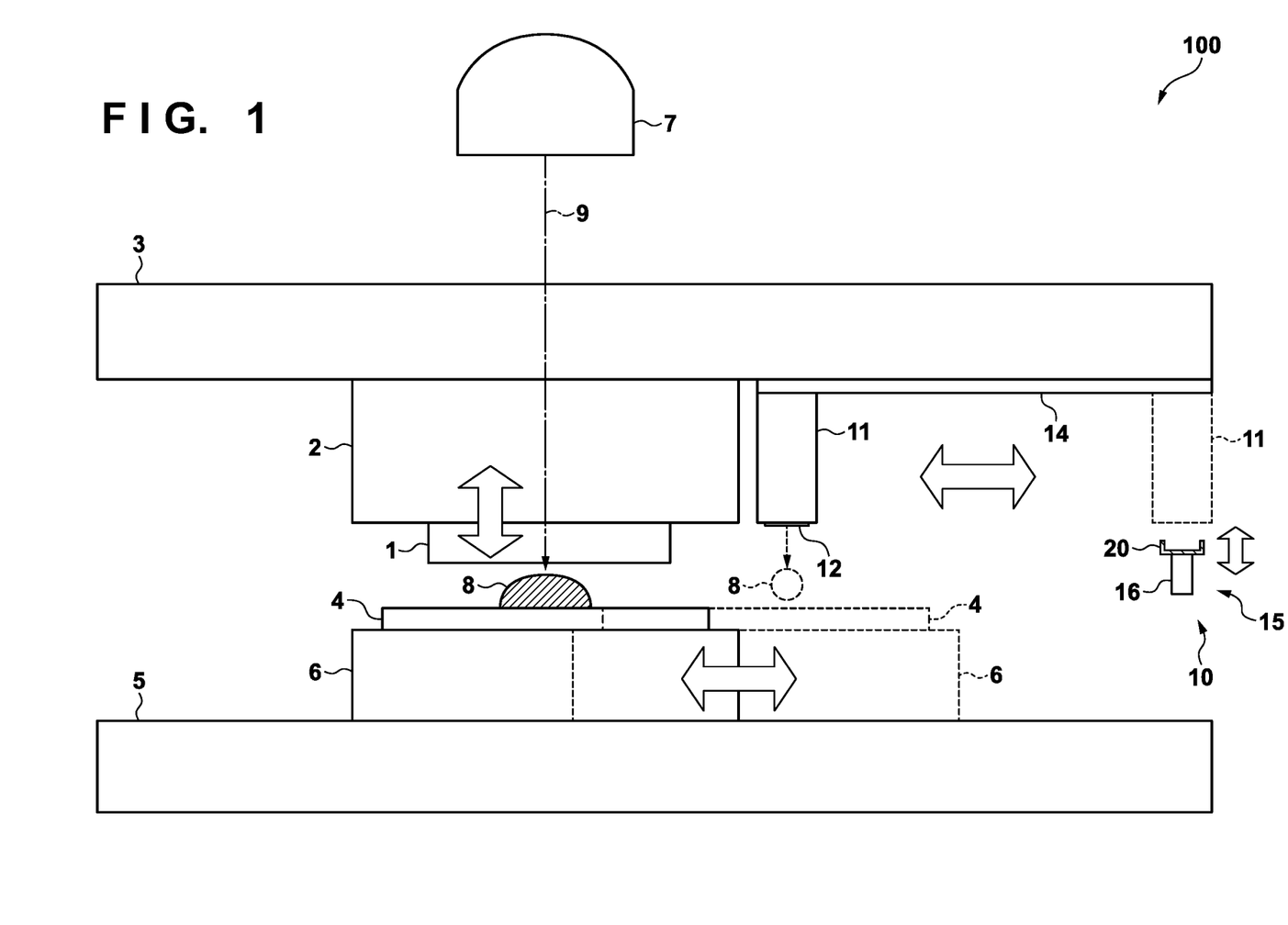
FIG. 1 is a schematic view of an imprint apparatus according to the first embodiment.

FIG. 1 is a schematic view of an imprint apparatus 100 according to the first embodiment of the present invention. In this case, an example in which a liquid discharge apparatus according to the present invention is applied to a nanoimprint apparatus will be described below. However, an apparatus to which the liquid discharge apparatus according to the present invention is applied is not limited to the imprint apparatus. For example, the liquid discharge apparatus according to the present invention is applicable to a wide variety of apparatuses each having a liquid discharge mechanism, such as a semiconductor manufacturing apparatus, a liquid crystal manufacturing apparatus, and an inkjet printer. It is assumed that the imprint apparatus 100 is, as an example, a UV photo-curing imprint apparatus in which a resin (resist) is cured upon irradiation of UV light (ultraviolet light). However, the present invention is also applicable to an imprint apparatus for curing a resin upon irradiation of light having another wavelength range or an imprint apparatus for curing a resin with another energy (for example, heat).

The imprint apparatus 100 coats a substrate 4 with a liquid resist 8, brings a mold 1 into contact with the coated resist 8, and cures the resist 8 by irradiating the resist 8 with ultraviolet light in this state. Accordingly, the pattern of the mold 1 can be transferred to the resist 8. A fine three-dimensional pattern is formed on the mold 1, and an element pattern corresponding to the mold pattern can be formed on the substrate 4.

The imprint apparatus includes a substrate stage 6 which holds the substrate 4. The substrate stage 6 is configured to be movable on a lower base frame 5. When the substrate stage 6 is located at a position indicated by a solid line in FIG. 1, a process for transferring the pattern of the mold 1 to the resist 8 is possible. In addition, when the substrate stage 6 is located at a position indicated by a broken line, a process for discharging the resist 8 from a discharge head 11 of a liquid discharge apparatus 10 to the substrate 4 is possible.

A driving mechanism 2 is supported on an upper base frame 3. The driving mechanism 2 is a mechanism for holding the mold 1 and vertically moving it. When the driving mechanism 2 moves the mold 1 downward, an operation for bringing the mold 1 close to the substrate 4 and pressing the mold 1 against the resist 8 is possible. An ultraviolet light generation apparatus 7 is arranged at a position above the mold 1. The ultraviolet light generation apparatus 7 emits ultraviolet light 9 on the resist 8 via the mold 1 to cure the resist 8. The ultraviolet light generation apparatus 7 has an arrangement including a light source such as a halogen lamp which generates, for example, an i-ray or g-ray and an optical system which focuses light generated by the light source.

The imprint apparatus 100 includes the liquid discharge apparatus 10. The liquid discharge apparatus 10 will be described with reference to FIGS. 1 and 2. The liquid discharge apparatus 10 includes a discharge head 11. The discharge head 11 includes a storage portion which stores the resist 8, and a discharge portion 12 for discharging a liquid (the resist 8) is formed below the storage portion. A plurality of nozzles are open to the discharge portion 12. The resist 8 stored in the storage portion is discharged downward. In this embodiment, the discharge portion 12 is formed as a planar discharge surface and is formed on the lower surface of the discharge head 11.

Figure 2:
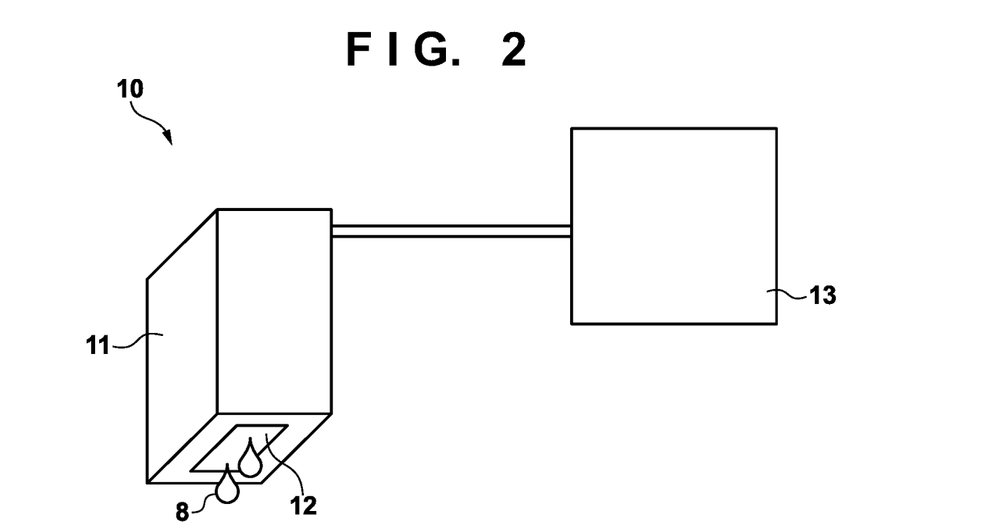
FIG. 2 is a schematic view of a discharge head.

A discharge element is arranged for each nozzle. The discharge element is an element for discharging the resist 8 in the nozzle by generating a pressure in the nozzle. For example, a heating element or piezoelectric element can be employed as the discharge element. If the discharge element is a heating element, a bubble is generated from the resist 8 by heat to discharge a liquid droplet. If the discharge element is a piezoelectric element, a liquid droplet is discharged by deformation of the element. A technique of an inkjet printer printhead can be applied to the discharge head 11.

The pressures of the discharge head 11 and the resist 8 in the discharge portion 12 are controlled by a pressure control unit 13 such that the shape of a discharge interface (meniscus) in the discharge portion 12 is stabilized. The pressure control unit 13 includes a liquid tank which stores the resist 8, a pressure sensor, a pump, a control valve, and the like. Note that the pressure at the discharge interface may be controlled using the differential head or controlled by an air pressure using a pump.

The liquid discharge apparatus 10 includes a moving mechanism 14 for moving the discharge head 11. The moving mechanism 14 is supported on the base frame 3 and can move the discharge head 11 between a discharge position indicated by the solid line in FIG. 1 and a maintenance position indicated by the broken line in FIG. 1. The discharge position is a position where the resist 8 is discharged onto the substrate 4. The maintenance position is a position falling outside the moving range of the substrate stage 6 and is a position where the performance of the discharge head 11 is maintained or recovered by a recovery unit 15.

The recovery unit 15 includes a cap 20 for capping the discharge head 11 and a driving mechanism 16 for moving the cap 20 between a capping position and a retreat position. At the capping position, the cap 20 hermetically covers the discharge portion 12 of the discharge head 11 located at the maintenance position. The retreat position is a position where the cap 20 is spaced apart from the discharge head 11. The remaining arrangement and details of the recovery unit 15 will be described later.

An example of the imprint operation of the imprint apparatus 100 will be described below. The imprint apparatus 100 is operated under the control of a control apparatus (not shown). The control apparatus includes a storage device which stores control programs, a processor for executing the control programs, and an interface with an external device.

First, the substrate 4 is mounted on the substrate stage 6. The substrate 4 is located below the discharge head 11 of the liquid discharge apparatus 10 by the movement of the substrate stage 6. By the movement of the substrate stage 6, the resist 8 is discharged from the discharge head 11 onto the substrate 4 while moving the substrate 4, thereby applying the resist 8 to a desired position on the substrate 4.

Next, by the movement of the substrate stage 6, the portion of the substrate 4 which has been coated with the resist 8 is located below the mold 1. By moving the mold 1 downward by the driving mechanism 2, the mold 1 comes close to the substrate 4. In this state, the alignment mark on the mold 1 and the alignment mark on the substrate 4 are overlapped by an alignment scope (not shown), thereby performing relative positional adjustment between them.

Next, by further moving the mold 1 toward the substrate 4 by the driving mechanism 2, the pattern of the mold 1 is pressed against the resist 8. After that, the ultraviolet light 9 is emitted from the ultraviolet light generation apparatus 7. The resist 8 is irradiated with the ultraviolet light 9 passing through the mold 1. The photo-curing reaction of the resist 8 is started to cure the resist 8. Finally, the mold 1 is moved upward by the driving mechanism 2 to separate the mold 1 from the cured resist 8. Therefore, the pattern is formed on the substrate 4 to end the imprint operation.

A device (a semiconductor integrated circuit element, a liquid crystal display element, or the like) can be manufactured using this imprint apparatus 100. This manufacturing method includes a step of forming a pattern on a substrate (a wafer, a glass plate, or a film-like substrate) using the above imprint apparatus 100. In addition, this manufacturing method includes a step (for example, an etching step) of processing a substrate on which a pattern is formed.

Note that when another article such as a patterned medium (recording medium) or an optical element is to be manufactured, this manufacturing method can include, instead of etching, another process for processing a substrate on which a pattern is formed.

Maintenance of Discharge Head

In the imprint apparatus 100, foreign matters (fine particles) and metal ions in the resist 8 are reduced to maintain the properties of the resist 8 until discharge onto the substrate 4, thereby improving the product quality. The discharge head 11 and the discharge portion 12 are manufactured in a clean environment, and the cleanliness is always maintained during the imprint and the maintenance. This also contributes to the improvement of the product quality. In nanoimprint, the attachment of particles to the discharge portion 12 may cause the attachment and mixing of the particles to the substrate 4 and the resist 8. This may cause the damage and defect of the mold 1.

In a series of imprint sequences, the resist 8 is repeatedly discharged from the discharge portion 12. During repeated discharge for a long period of time, the resist 8 is solidified at the discharge port of the discharge portion 12, or bubbles may be mixed inside the nozzles of the discharge portion 12. In addition, the viscosity and properties of the resist 6 left in the nozzles of the discharge portion 12 which has not been used for a predetermined period of time may change due to the influence of volatility.

The changes in the states of the discharge port and resist may cause degradation of the discharge characteristics such as the amount, discharge speed, and discharge direction of the resist 8 discharged from the discharge portion 12. The recovery unit 15 is arranged to recover the discharge performance of the discharge portion 12. In this case, a cleaning function of forcibly discharging the resist 8 and the like left in the discharge portion 12 or attached to its periphery will be mainly described below.

Figure 3:
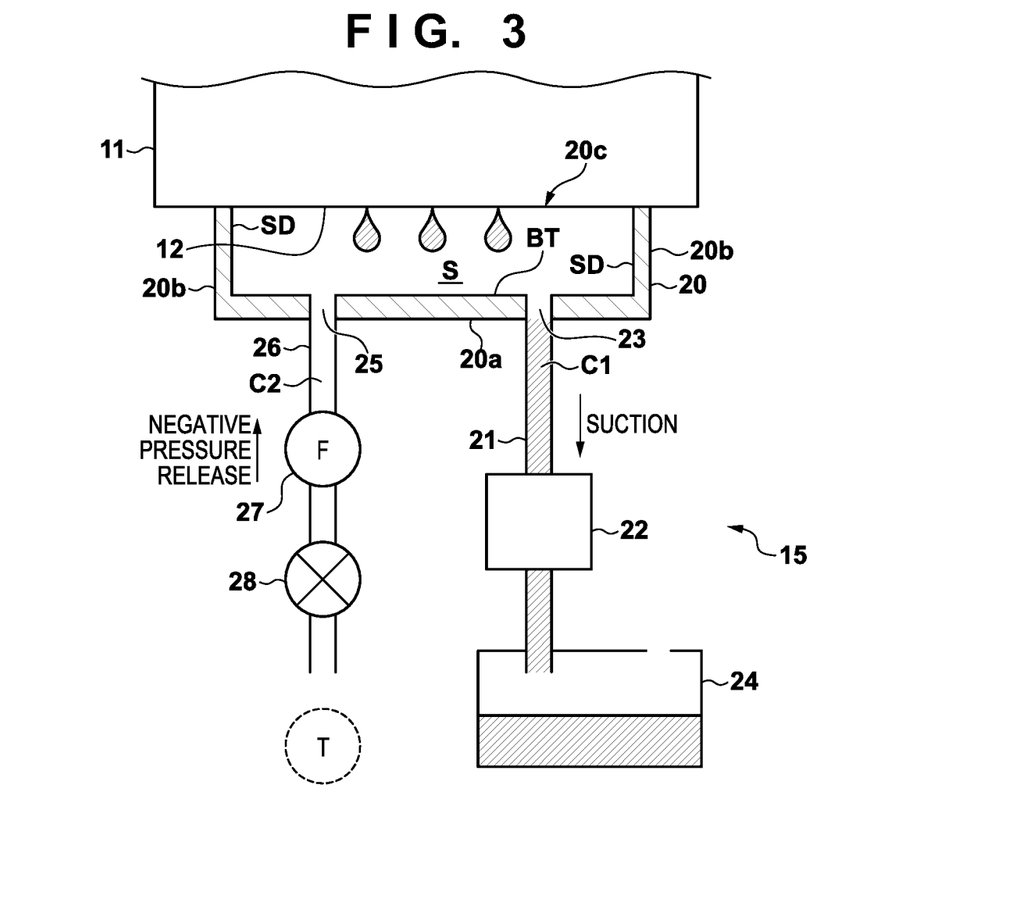
FIG. 3 is a view for explaining a recovery unit.

FIG. 3 shows particularly an arrangement for performing a suction recovery operation of the discharge portion 12 out of the arrangement of the recovery unit 15. The cap 20 has a shape which surrounds the discharge portion 12. In this embodiment, the cap 20 has a parallelepiped shape as a whole. The cap 20 includes a rectangular bottom wall portion 20a and four side wall portions 20b extending upright from the bottom wall portion 20a. The top portion is open, thus forming a rectangular opening portion 20c which surrounds the discharge portion 12. FIG. 3 shows a case in which the cap 20 is located at the capping position. The upper ends of the side wall portions 20b hermetically contact the bottom surface of the discharge head 11.

An interior S of the cap 20 is a space defined by a bottom portion BT and side portions SD and having an open top. In the capping state shown in FIG. 3, the opening portion 20c of the interior S is closed by the discharge head 11 and is kept in a hermetic space. The discharge portion 12 is located in this hermetic space.

The bottom portion BT is formed in a planar shape by the bottom wall portion 20a. Each side portion SD is formed in a planar shape by the corresponding side wall portion 20b. A discharge port 23 extends through the bottom wall portion 20a and is connected to a passage forming member 21. If the discharge port 23 is formed in the bottom wall portion 20a as in this embodiment, the resist 8 to be discharged can readily flow into the discharge port 23 due to the weight of the resist 8. The bottom portion BT may be tapered inclining toward the discharge port 23. Accordingly, the resist 8 to be discharged can readily flow into the discharge port 23 by the weight of the resist 8.

The passage forming member 21 is made of, for example, a flexible pipe (for example, a rubber tube). A fluid passage C1 communicating with the interior of the cap 20 is formed by the passage forming member 21. A suction mechanism 22 is arranged midway along the passage forming member 21. A tank 24 for performing the gas-liquid separation of the discharged resist 8 and recovering the resist 8 is arranged at the end portion of the passage forming member 21. A mist separator may be arranged in the fluid passage C1.

The suction mechanism 22 includes a negative pressure source such as a pump or ejector (vacuum generator) and a control valve for opening/closing the fluid passage C1. In a case in which the suction recovery operation of the discharge portion 12 is to be performed, the control valve of the suction mechanism 22 is opened to operate the negative pressure source while the cap 20 is set in the capping state of capping the discharge portion 12, thereby sucking the interior S via the fluid passage C1. The interior S is set in a negative pressure state, and the resist 8 is sucked from the discharge portion 12. The resist 8 is recovered to the tank 24 via the fluid passage C1. At this time, if the interior of the discharge head 11 is opened to the outer air by the pressure control unit 13, the resist 8 can be more efficiently sucked from the discharge portion 12. In addition, when the interior of the discharge head 11 is pressurized by the pressure control unit 13, the resist 8 can be more efficiently sucked from the discharge portion 12.

As described above, cleaning for forcibly discharging the resist 8 in the discharge portion 12 and recovering and maintaining its performance can be performed. When the cap 20 is moved to the retreat position upon completion of this operation, the negative pressure state of the interior S must be canceled. As an arrangement for this purpose, a passage forming member 26, a filter 27, and a control valve 28 are arranged.

A negative pressure elimination port 25 extends through the bottom wall portion 20a. The passage forming member 26 is connected to the negative pressure elimination port 25. The passage forming member 26 is made of, for example, a flexible pipe (for example, a rubber tube). A fluid passage C2 communicating with the interior of the cap 20 is formed by the passage forming member 26. The end portion of the fluid passage C2 is open to the ambient atmosphere (in this case, the outer air) of the cap 20 in this embodiment.

The control valve 28 opens/closes the fluid passage C2. During the above suction recovery operation, the control valve 28 is set in the closed state and does not inhibit generation of the negative pressure in the interior S. In order to cancel the negative pressure state of the interior S, the control valve of the suction mechanism 22 is set in the closed state to close the fluid passage C1, thereby setting the control valve 28 in the open state. Accordingly, the interior S communicates with the outer air via the fluid passage C2, thereby canceling the negative pressure state of the interior S.

Figure 4:
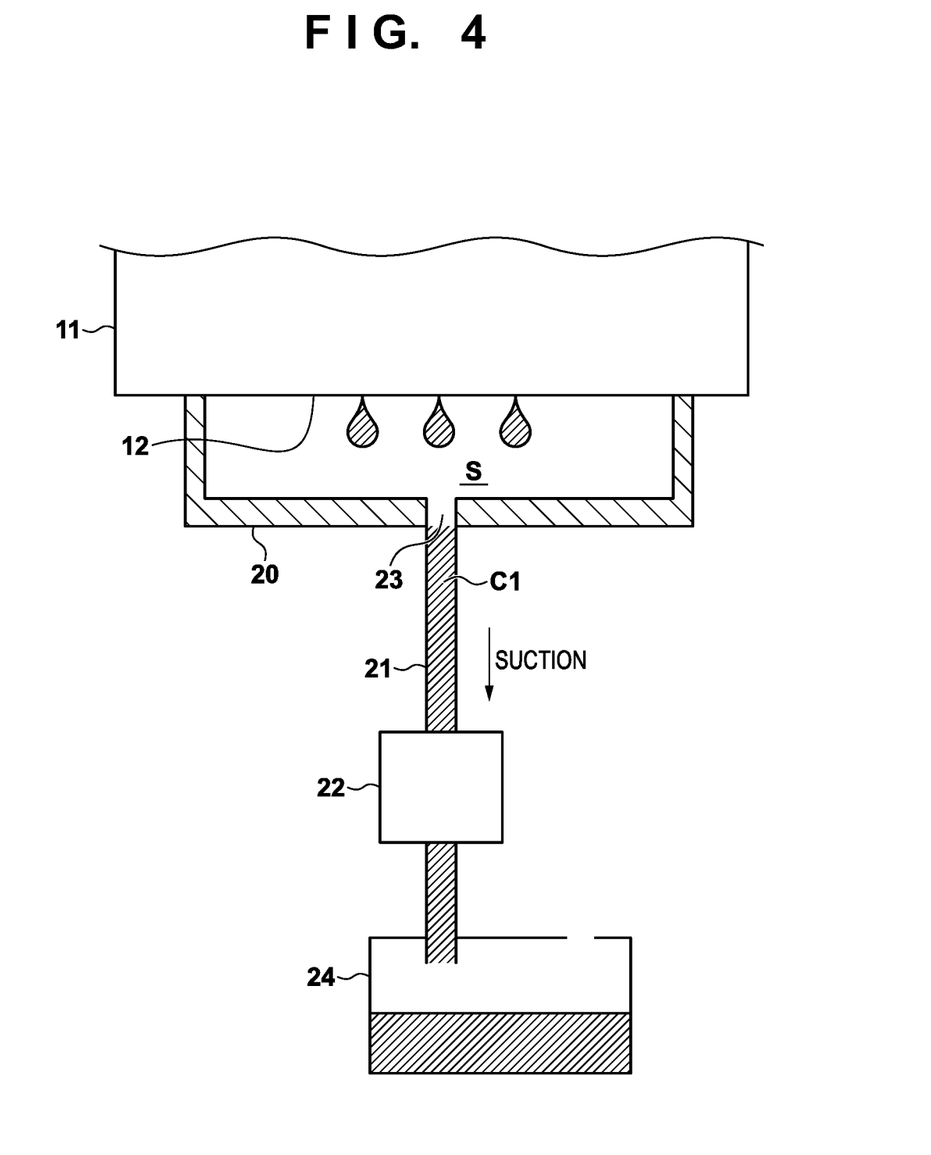
FIG. 4 is a view for explaining a recovery unit according to a comparative example.

As a method of canceling the negative pressure state of the interior S, there is also considered a method using the fluid passage C1 without forming the fluid passage C2, unlike the above embodiment. This arrangement is illustrated as a comparative example in FIG. 4. In this arrangement, the negative pressure source of the suction mechanism 22 is stopped to open the control valve, thereby canceling the negative pressure state of the interior S. When releasing the negative pressure of the interior S, the resist 8 present in the fluid passage C1 or near the discharge port 23 may flow back and spray into the interior S. This degrades the cleaning effect of the discharge portion 12.

To the contrary, in the arrangement example of this embodiment shown in FIG. 3, since the fluid passage C2 for releasing the negative pressure is formed independently of the fluid passage C1 for negative pressure suction, the sucked resist 8 will not return to the interior S. According to the arrangement example of this embodiment, however, outer air flows into the interior S via the fluid passage C2, and the outer air may be sprayed to the discharge portion 12 depending on the degree of the negative pressure. If the particles are contained in the outer air, the particles may be attached to the discharge portion 12. In the imprint operation, this may cause the attachment of particles to the substrate 4 serving as the discharge target of the resist 8.

For this purpose, in this embodiment, the filter 27 is arranged in the fluid passage C2. The outer air introduced into the interior S through the fluid passage C2 is filtered through the filter 27, and the particles are removed. When canceling the negative pressure state, the particles can be prevented from being attached to the discharge portion 12. When the application to the imprint apparatus 100 is considered, a filter which can capture foreign matters having a particle size of 10 nm or more is used as the filter 27 to effectively prevent the attachment of the particles which can influence the imprint quality. The position of the filter 27 in the fluid passage C2 can be arbitrary. However, as in this embodiment, by employing a position nearer to the side of the negative pressure elimination port 25 than the devices such as the control valve 28, even if the particles are generated from the devices such as the control valve 28, the particles can advantageously be prevented by the filter 27 from entering the interior S.

Note that in this embodiment, the negative pressure state can be canceled by sucking the ambient air of the cap 20 into the interior S of the negative pressure state via the fluid passage C2. The fluid introduced into the interior S is not limited to air. For example, a tank T indicated by a broken line may be connected to the end portion of the passage forming member 26 to introduce the fluid in the tank T into the interior S. The fluid in the tank T may be, for example, a gas such as nitrogen which can be managed in cleanliness and purity easier than air. The fluid in the tank T may be a gas with which the resist vapor is filled. When the interior S is filled with the vapor, the humidity of the discharge portion 12 can be maintained, and the condensation and solidification of the resist in the nozzle can be prevented.

Second Embodiment

Figure 5:
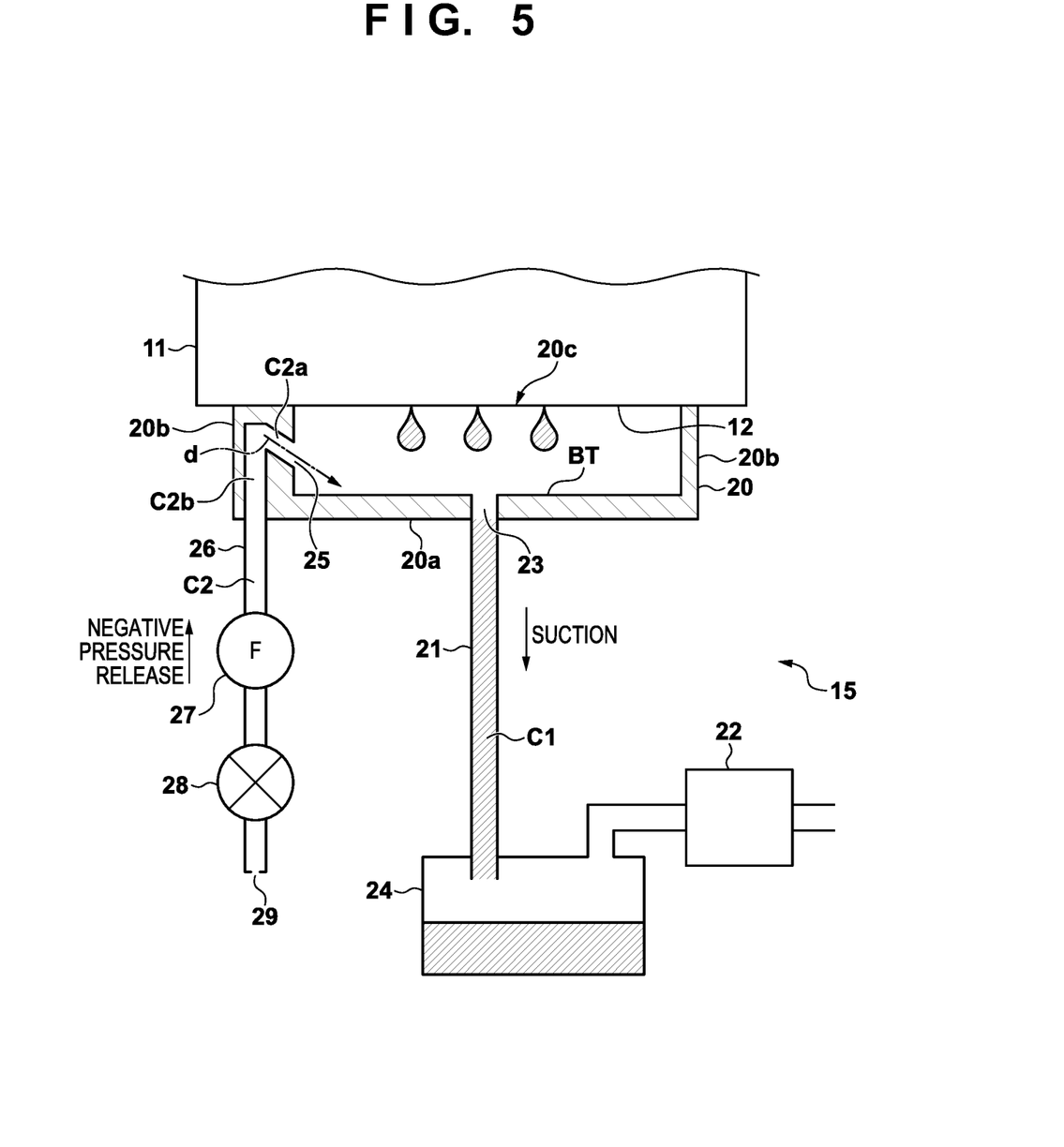
FIG. 5 is a view for explaining a recovery unit according to the second embodiment.

The second embodiment will be described with reference to FIG. 5. Parts different from the first embodiment will be described below.

This embodiment is different from the first embodiment in the arrangement of a suction mechanism 22 and a tank 24 on a fluid passage C1. In this embodiment, the tank 24 is arranged between a discharge port 23 and the suction mechanism 22. An interior S of a cap 20 and the interior of the tank 24 are set in the negative pressure state by the suction operation of the suction mechanism 22. When canceling the negative pressure state of the cap 20, a control valve 28 and the control valve of the suction mechanism 22 may be opened. Since the tank 24 is set in the negative pressure state, a resist 8 present in the fluid passage C1 between the discharge port 23 and the tank 24 does not flow back to the cap 20 and is sucked into the tank 24.

A flow velocity reducing portion 29 is arranged in a fluid passage C2. In this embodiment, the flow velocity reducing portion 29 is a pin-hole throttle whose passage diameter is locally reduced. The throttle opening is about 0.5 mm to 1 mm in diameter. The position of the flow velocity reducing portion 29 is arbitrary on the fluid passage C2 but is an end in this embodiment. When canceling the negative pressure state of the cap 20, outer air around the fluid passage C2 is sucked, but the flow velocity of the outer air can be reduced when it passes through the flow velocity reducing portion 29. For example, the flow velocity reducing portion 29 can be designed such that the flow velocity of the flow-in fluid can be reduced to 1 m/s or less. Accordingly, the fluid introduced into the cap 20 through the fluid passage C2 can be prevented from strongly blowing a discharge portion 12, thereby suppressing the attachment of the particles to the discharge portion 12.

In this embodiment, a negative pressure elimination port 25 of the fluid passage C2 is open to a corresponding side portion SB. This arrangement can more suppress the resist 8 from entering the negative pressure elimination port 25 during the negative pressure suction operation than the arrangement in which the negative pressure elimination port 25 is open to a bottom portion BT as in the first embodiment. For this reason, when canceling the negative pressure state of the interior S of the cap 20, the resist 8 present in the negative pressure elimination port 25 can be prevented from flowing back into the interior S of the cap 20.

In this embodiment, the fluid passage C2 includes an outlet passage portion C2a including the negative pressure elimination port 25 and a midway portion C2b. These portions are formed in a corresponding side wall portion 20b. A passage direction d of the outlet passage portion C2a is directed closer to the bottom portion BT than the discharge portion 12. When canceling the negative pressure state of the interior S of the cap 20, the flow of the fluid introduced from the negative pressure elimination port 25 into the interior S tends to move toward the bottom portion BT. Accordingly, the flow is not directed to the discharge portion 12, and the fluid will not be directly blown to the discharge portion 12.

One end of the outlet passage portion C2a forms the negative pressure elimination port 25, and the other end is connected to the midway portion C2b. The outlet passage portion C2a and the midway portion C2b form a bent passage. For this reason, the flow velocity of the fluid passing through the passage can be reduced. The fluid introduced into the cap 20 through the fluid passage C2 can further be prevented from strongly blowing the discharge portion 12.

In this embodiment, the midway portion C2b extends from the side of a bottom wall portion 20a to the side of an opening portion 20c. In other words, the midway portion C2b extends in the thickness direction of the cap 20. The outlet passage portion C2a extends obliquely from the end portion on the side of the opening portion 20c of the midway portion C2b to the bottom portion BT of the interior S. Since the passage is abruptly bent in a wedge shape by the midway portion C2b and the outlet passage portion C2a, an effect of reducing the flow velocity of the fluid passing through the passage can be improved.

Note that although the filter 27 is arranged in the second embodiment as in the first embodiment, the second embodiment may employ an arrangement without the filter 27. The attachment of the particles to the discharge portion 12 can be prevented by a blowing suppression function of suppressing the blowing to the discharge portion 12.

Third Embodiment

Figure 6A:
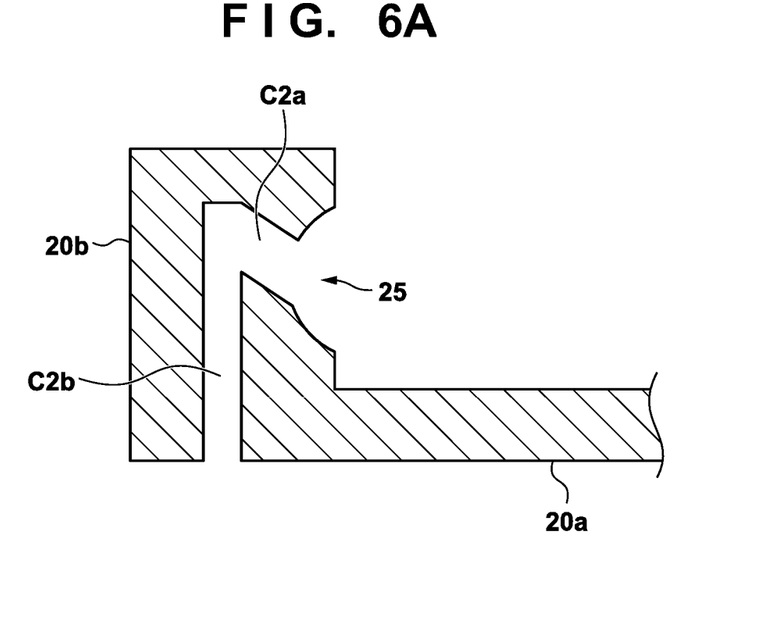
FIGS. 6A and 6B are views showing another example of a flow velocity reducing portion.
Figure 6B:
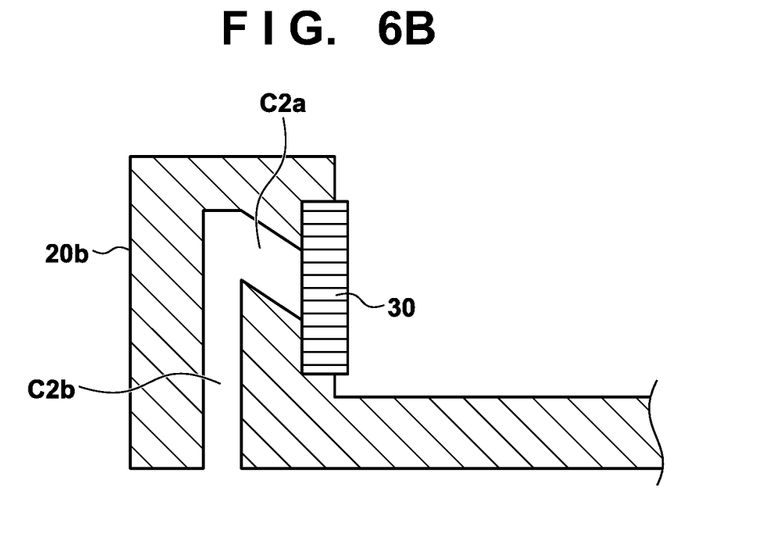

Any member except a throttle can be used as an arrangement example of a flow velocity reducing portion 29 exemplified in the second embodiment. FIGS. 6A and 6B show other examples. In the example of FIG. 6A, a flow velocity reducing portion is formed as an enlarged sectional-area portion which increases the sectional area of the passage in the opening end (near a negative pressure elimination port 25 of an outlet passage portion C2a in the illustrated example) of a fluid passage C2. By increasing the opening of the negative pressure elimination port 25, the flow velocity of the fluid flowing into an interior S of a cap 20 can be reduced.

The example of FIG. 6B is a case in which a porous member 30 is arranged. In the illustrated example, the porous member 30 is arranged at the position of the negative pressure elimination port 25. However, the porous member 30 can be arranged at an arbitrary position of the fluid passage C2. The porous member 30 is a member having a plurality of apertures open in the passage direction of the fluid passage C2. The porous member 30 is made of a mesh-like member or a honeycomb member. When this porous member 30 is arranged, the flow velocity of the fluid flowing into the interior S of the cap 20 can be reduced.

Fourth Embodiment

Figure 7:
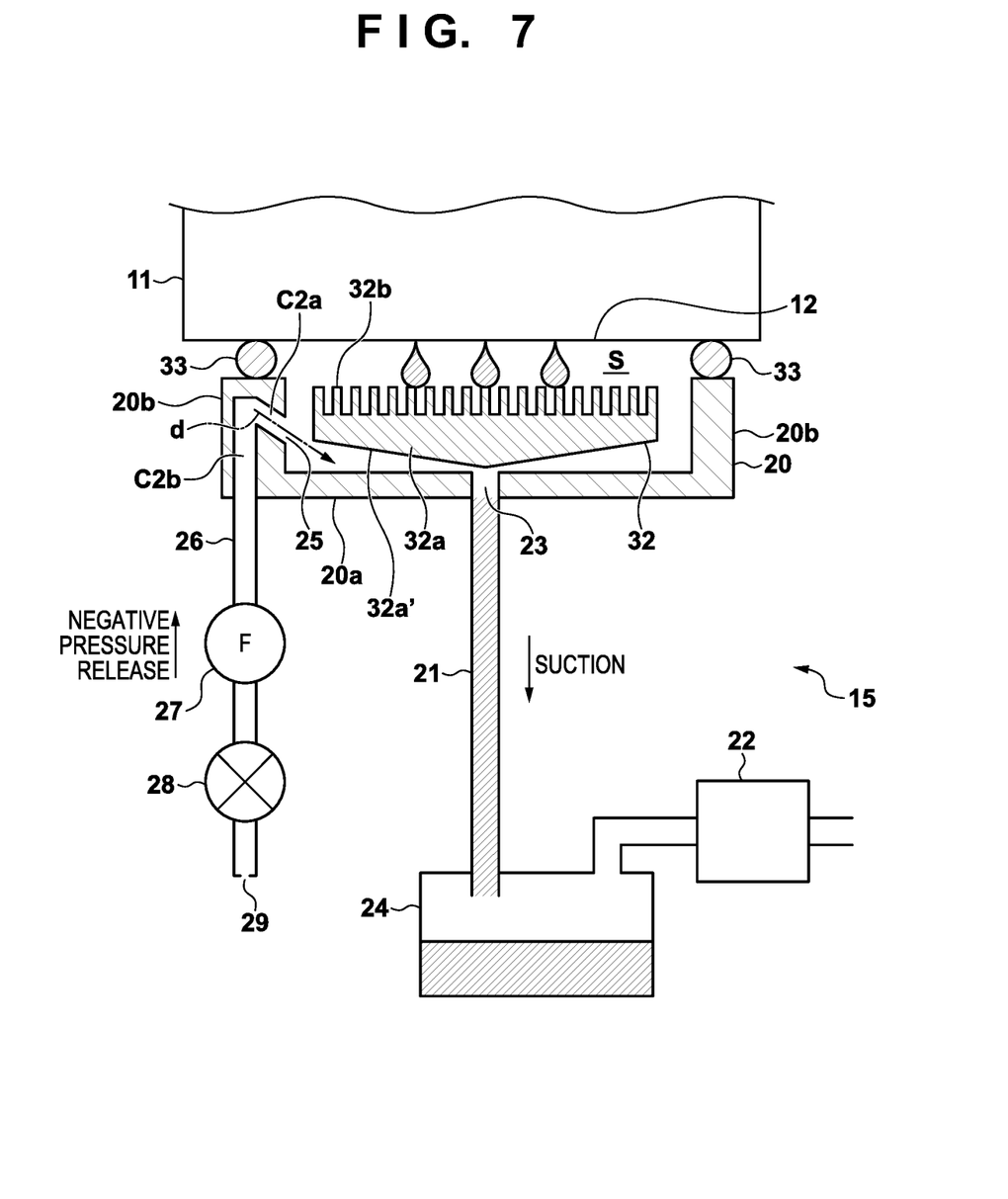
FIG. 7 is a view for explaining a recovery unit according to the third embodiment.

The third embodiment will be described with reference to FIG. 7. Parts different from the second embodiment will be described below. In the third embodiment, a seal member 33 is arranged between a cap 20 and a discharge head 11 to improve hermetic property of an interior S of the cap 20 in capping. The seal member 33 is made of, for example, an O-ring, gasket, or lip seal.

A restricting member 32 is arranged in the interior S of the cap 20. The restricting member 32 is arranged so as to restrict generation of a fluid flow from a midway portion C2b to a discharge portion 12. The restricting member 32 will be described with reference to FIGS. 7 and 8A.

Figure 8A:
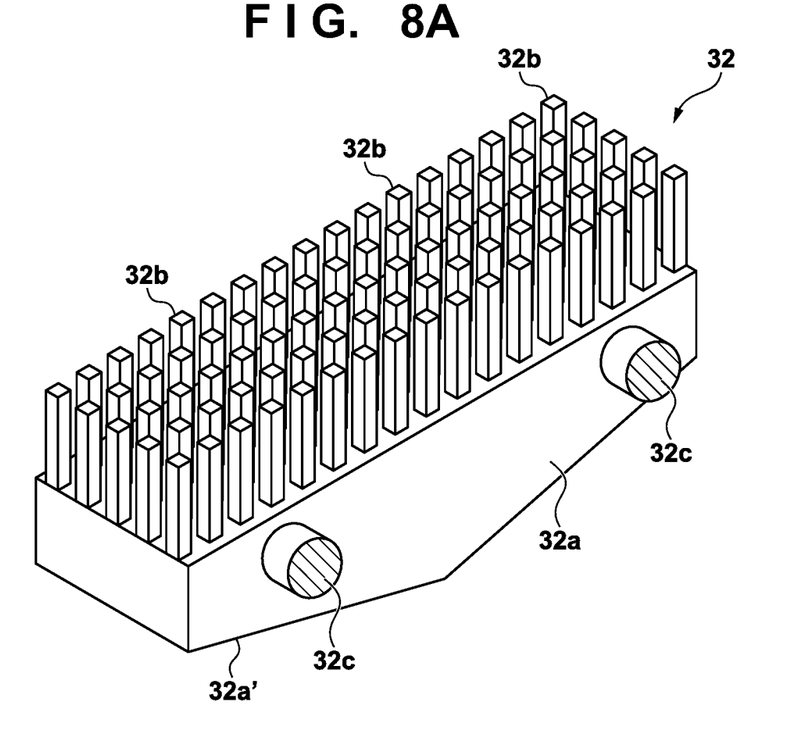
FIG. 8A is a view for explaining a restricting member.

The restricting member 32 is a block-like member arranged at a position facing the negative pressure elimination port 25 so as to interfere with the fluid flow flowing from a negative pressure elimination port 25 into the interior S of the cap 20. Beams 32c of the restricting member 32 are connected to corresponding side wall portions 20b of the cap 20, so that the restricting member 32 is supported by the cap 20 so as to float from a bottom portion BT in the interior S.

A guide surface 32a' is formed at the bottom portion of the restricting member 32 such that the guide surface 32a' is formed closer to the bottom portion BT than the discharge portion 12 and guides the fluid flowing from a fluid passage C2 to the interior S toward the bottom portion BT. In this embodiment, the guide surface 32a' is a tilt surface extending from the position facing the negative pressure elimination port 25 to a discharge port 23. When canceling the negative pressure state of the interior S of the cap 20, the flow of the fluid introduced from the negative pressure elimination port 25 to the interior S can be suppressed by the guide surface 32a' from flowing toward the discharge portion 12 and promoted to flow toward the bottom portion BT. This can make it possible to prevent the flow from directing toward the discharge portion 12 and from being directly blown to the discharge portion 12.

A plurality of projections 32b arrayed in a comb-like manner toward the discharge portion 12 so as to face the discharge portion 12 are arranged on the upper portion of the restricting member 32. A groove is formed between the projections 32b. When performing the negative pressure suction operation, a resist 8 discharged from the discharge portion 12 is received by this groove. When the interval between the adjacent projections 32b is set to, for example, 0.2 mm to 0.5 mm, the liquid droplets of the resist 8 discharged from the discharge portion 12 can be easily recovered by the capillary action of the comb-like structure. The liquid droplets of the resist 8 flowing into the groove get together to increase the size. The liquid droplets flowing toward the side surface sides of the restricting member 32 drop on the bottom portion BT along the side surfaces by their own weights and flow toward the discharge port 23. Note that the recovery promotion structure for the resist 8 is not limited to the comb-like structure. A porous member obtained by solidifying a metal powder by heat may be used. In addition, a foamed member such as sponge or an aggregate of hair-like bodies such as a brush can also be employed. A structure which does not use the capillary action may also be used. Alternatively, a structure may be employed in which a flat surface may be brought close to the surface of the discharge portion 12, and a groove or pattern is formed on the flat surface to guide the liquid. The structure has a lyophilic surface.

As described above, the restricting member 32 of this embodiment has not only a function of suppressing the fluid blowing toward the discharge portion 12 when canceling the negative pressure state, but also a function of promoting the recovery of the resist 8 when performing the negative pressure suction operation.

Figure 8B:
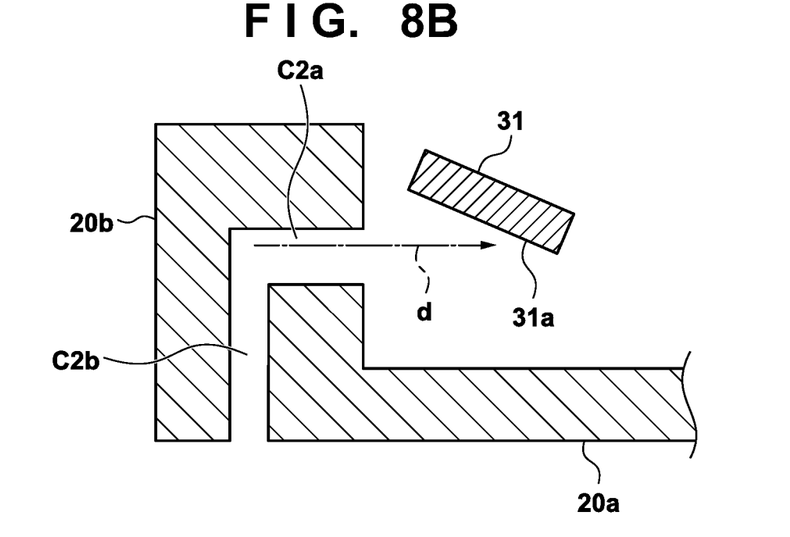
FIG. 8B is a view for explaining another restricting member.

A restricting member 31 exemplified in FIG. 8B can also be employed as the restricting member 32. The restricting member 31 is a plate-like member arranged at a position facing the negative pressure elimination port 25 so as to interfere with the fluid flow flowing from the negative pressure elimination port 25 into the interior S of the cap 20. The lower surface of the restricting member 31 forms a guide surface 31a which is formed more facing to the bottom portion BT than the discharge portion 12 and makes the fluid flow from the fluid passage C2 to the bottom portion Bt and into the interior S.

Note that in this embodiment, a filter 27 is arranged as in the first embodiment, but an arrangement without the filter 27 may be employed. Even if the filter 27 is absent, the attachment of the particles to the discharge portion 12 can be suppressed by the blowing suppression function of the restricting member 32 (or 31) of suppressing the blowing to the discharge portion 12.

In this embodiment, as in the second embodiment, a fluid passage C2 includes an outlet passage portion C2a and a midway portion C2b. However, like the fluid passage C2 or the like which is opened to the bottom portion BT as in the first embodiment, another structure can be employed as the structure of the fluid passage C2. The attachment of the particles to the discharge portion 12 can be prevented by the blowing suppression function of the restricting member 32 (or 31) of suppressing blowing to the discharge portion 12.

As in the second embodiment, this embodiment employs an arrangement in which the fluid passage C2 includes a flow velocity reducing portion 29. However, an arrangement without the flow velocity reducing portion 29 can also be employed.

Other Embodiments

The above embodiments can be combined with each other, and the respective constituent elements of one embodiment can be employed as the constituent elements of another embodiment, as needed.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-232740, filed Dec. 4, 2017, which is hereby incorporated by reference herein in its entirety.

What is claimed is:

1. A liquid discharge apparatus comprising:
   a discharge head including a discharge portion configured to discharge a liquid;

a cap including a bottom wall portion which faces the discharge portion, a first side wall portion and a second side wall portion both extending from the bottom wall portion, and configured to cap the discharge portion, wherein the first side wall portion is thicker than the second side wall portion;

a suction unit configured to suck an interior of the cap through a first fluid passage communicating with the interior of the cap so as to generate a negative pressure state of the interior of the cap in a state in which the cap caps the discharge portion;

a second fluid passage including an outlet passage portion which connects with an opening in the first side wall portion, and a midway portion which connects with the outlet passage portion and extends toward the bottom wall portion, wherein the outlet passage portion and the midway portion form a bent passage, an open/close unit configured to open/close the second fluid passage communicating with the interior of the cap, the open/close unit being set in an open state so as to introduce outer air into the interior of the cap under the negative pressure state through the second fluid passage when the negative pressure state is canceled; and a filter arranged in the midway portion and configured to prevent a foreign matter in the outer air from entering the interior of the cap.

2. The liquid discharge apparatus according to claim 1, wherein the filter is arranged between the bottom wall portion of the cap and the open/close unit.

3. The liquid discharge apparatus according to claim 1, wherein the filter captures the foreign matter whose particle size is not less than 10 nm.

4. The liquid discharge apparatus according to claim 1, further comprising a flow velocity reducing portion arranged in the second fluid passage and configured to reduce a flow velocity of a fluid flowing through the second fluid passage.

5. The liquid discharge apparatus according to claim 4, wherein the flow velocity reducing portion is a portion of which a sectional-area increases toward the opening in the first side wall portion.

6. The liquid discharge apparatus according to claim 1, wherein if the open/close unit is in the open state, the interior of the cap communicates with outer air through the second fluid passage.

7. An imprint apparatus comprising a liquid discharge apparatus for discharging a resin onto a substrate, the liquid discharge apparatus including:

a discharge head including a discharge portion configured to discharge a liquid;

a cap including a bottom wall portion which faces the discharge portion, a first side wall portion and a second side wall portion both extending from the bottom wall portion, and configured to cap the discharge portion, wherein the first side wall portion is thicker than the second side wall portion;

a suction unit configured to suck an interior of the cap through a first fluid passage communicating with the interior of the cap so as to generate a negative pressure state of the interior of the cap in a state in which the cap caps the discharge portion;

a second fluid passage including an outlet passage portion which connects with an opening in the first side wall portion, and a midway portion which connects with the outlet passage portion and extends toward the bottom wall portion, wherein the outlet passage portion and the midway portion form a bent passage, an open/close unit configured to open/close the second fluid passage communicating with the interior of the cap, the open/close unit being set in an open state so as to introduce outer air into the interior of the cap under the negative pressure state through the second fluid passage when the negative pressure state is canceled; and a filter arranged in the midway portion and configured to prevent a foreign matter in the outer air from entering the interior of the cap.

8. The liquid discharge apparatus according to claim 1, wherein the second fluid passage is bent in the first side wall portion.

9. The liquid discharge apparatus according to claim 1, wherein the outlet passage portion extends toward the bottom wall portion.

10. The imprint apparatus according to claim 7, wherein the filter is arranged between the bottom wall portion of the cap and the open/close unit.

11. The imprint apparatus according to claim 7, wherein the filter captures the foreign matter whose particle size is not less than 10 nm.

12. The imprint apparatus according to claim 7, further comprising a flow velocity reducing portion arranged in the second fluid passage and configured to reduce a flow velocity of a fluid flowing through the second fluid passage.

13. The imprint apparatus according to claim 12, wherein the flow velocity reducing portion is a portion of which a sectional-area increases toward the opening in the first side wall portion.

14. The imprint apparatus according to claim 7, wherein if the open/close unit is in the open state, the interior of the cap communicates with outer air through the second fluid passage.

15. The imprint apparatus according to claim 7, wherein the second fluid passage is bent in the first side wall portion.

16. The imprint apparatus according to claim 7, wherein the outlet passage portion extends toward the bottom wall portion.

* * * * *